United States Patent
Liu et al.

(10) Patent No.: US 10,923,379 B2
(45) Date of Patent: Feb. 16, 2021

(54) METHODS FOR CONTROLLING CLAMPING OF INSULATOR-TYPE SUBSTRATE ON ELECTROSTATIC-TYPE SUBSTRATE SUPPORT STRUCTURE

(71) Applicant: Lam Research Corporation, Fremont, CA (US)

(72) Inventors: Chin-Yi Liu, San Jose, CA (US);
Daniel Lai, San Jose, CA (US);
Rajitha Vemuri, Tempe, AZ (US);
Padma Gopalakrishnan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/433,943

(22) Filed: Feb. 15, 2017

(65) Prior Publication Data
US 2018/0233393 A1 Aug. 16, 2018

(51) Int. Cl.
| H01L 21/383 | (2006.01) |
| H01L 21/67 | (2006.01) |
| H01J 37/32 | (2006.01) |
| H01L 21/683 | (2006.01) |

(52) U.S. Cl.
CPC .... *H01L 21/6833* (2013.01); *H01J 37/32697* (2013.01); *H01J 37/32715* (2013.01); *H01J 37/32926* (2013.01); *H01L 21/67109* (2013.01); *H01L 21/67253* (2013.01); *H01J 2237/332* (2013.01)

(58) Field of Classification Search
CPC ............. H01L 21/6833; H01L 21/0234; H01J 37/32926; H01J 37/32697; H01J 37/32715; H01J 2237/332
See application file for complete search history.

(56) References Cited

U.S. PATENT DOCUMENTS

| 5,491,603 | A |   | 2/1996 | Birang |
| 5,748,436 | A | * | 5/1998 | Honma ............... H01L 21/6831 279/128 |
| 5,793,192 | A | * | 8/1998 | Kubly ................ H01L 21/6833 279/128 |

(Continued)

FOREIGN PATENT DOCUMENTS

EP 0680083 A2 11/1995

*Primary Examiner* — Jose I Hernandez-Kenney
(74) *Attorney, Agent, or Firm* — Penilla IP, APC

(57) ABSTRACT

An insulator-type substrate is positioned on a support surface of a substrate support structure in exposure to a plasma. An initial clamping voltage is applied to an electrode within the substrate support structure to rapidly accumulate electrical charge on the support surface to hold the substrate. A backside cooling gas is flowed to a region between the substrate and the support surface, and a leak rate of the backside cooling gas is monitored. A steady clamping voltage is applied to the electrode, and the steady clamping voltage is adjusted in a step-wise manner to maintain the monitored leak rate of the backside cooling gas at just less than a maximum allowable leak rate. Or, a pulsed clamping voltage is applied to the electrode, and the pulsed clamping voltage is adjusted to maintain the monitored leak rate of the backside cooling gas at just less than the maximum allowable leak rate.

15 Claims, 7 Drawing Sheets

(56) References Cited

U.S. PATENT DOCUMENTS

| | | | | |
|---|---|---|---|---|
| 6,125,025 | A * | 9/2000 | Howald | H01L 21/6833 |
| | | | | 279/128 |
| 6,198,616 | B1 * | 3/2001 | Dahimene | H01L 21/6831 |
| | | | | 279/128 |
| 6,947,274 | B2 * | 9/2005 | Kellerman | H01L 21/6833 |
| | | | | 361/234 |
| 7,939,869 | B2 * | 5/2011 | Tsuchiaki | G11C 16/0441 |
| | | | | 257/295 |
| 9,048,289 | B2 * | 6/2015 | Harper | H01L 21/76254 |
| 2001/0046112 | A1 * | 11/2001 | Herchen | H01L 21/6831 |
| | | | | 361/234 |
| 2005/0057881 | A1 | 3/2005 | Qin et al. | |
| 2007/0223173 | A1 * | 9/2007 | Fujisawa | H01L 21/6833 |
| | | | | 361/234 |
| 2008/0192405 | A1 * | 8/2008 | Purohit | H01L 21/6833 |
| | | | | 361/234 |
| 2010/0254063 | A1 * | 10/2010 | Sheng | H01L 21/6833 |
| | | | | 361/234 |
| 2014/0158301 | A1 * | 6/2014 | Maehira | H01J 37/321 |
| | | | | 156/345.29 |
| 2015/0009602 | A1 * | 1/2015 | Adachi | H01L 21/6833 |
| | | | | 361/234 |

\* cited by examiner

METHODS FOR CONTROLLING CLAMPING OF INSULATOR-TYPE SUBSTRATE ON ELECTROSTATIC-TYPE SUBSTRATE SUPPORT STRUCTURE

BACKGROUND

1. Field of the Invention

The present invention relates to electronic device fabrication.

2. Description of the Related Art

Many modern electronic device fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. In some cases, the substrate is an insulator substrate such as glass, sapphire, or the like. The insulator substrate is securely held on a support structure during its exposure to the plasma. In some cases, because the insulator substrate is not electrically conductive, the insulator substrate is held on the support structure using mechanical clamping devices positioned over the peripheral edge of the insulator substrate. The locations at which these mechanical clamping devices contact the top surface of the insulator substrate are not available for manufacturing of electronic devices. Therefore, use of the mechanical clamping devices can adversely impact device yield from a given insulator substrate. Also, physical contact between the mechanical clamping devices and the insulator substrate can increase a potential for damage to the insulator substrate or materials formed thereon. Therefore, it is of interest to have a way of securing an insulator substrate to a support structure during plasma processing of the insulator substrate without use of mechanical clamping devices. It is within this context that the present invention arises.

SUMMARY

In an example embodiment, a method is disclosed for controlling a clamping voltage applied to a substrate support structure for holding an insulator-type substrate. The method includes positioning the insulator-type substrate on a support surface of the substrate support structure. The method also includes applying an initial clamping voltage to an electrode within the substrate support structure to rapidly accumulate enough electrical charge on the support surface to hold the insulator-type substrate. The method also includes generating a plasma in exposure to the insulator-type substrate. The method also includes flowing a backside cooling gas to a region between the insulator-type substrate and the substrate support structure. The method also includes monitoring a leak rate of the backside cooling gas from the region between the insulator-type substrate and the substrate support structure. The method also includes applying a reduced clamping voltage to the electrode within the substrate support structure upon determining that the leak rate of the backside cooling gas is less than a maximum allowable leak rate.

In an example embodiment, a method is disclosed for controlling a clamping voltage applied to a substrate support structure for holding an insulator-type substrate. The method includes positioning the insulator-type substrate on a support surface of the substrate support structure. The method also includes applying an initial clamping voltage to an electrode within the substrate support structure to rapidly accumulate enough electrical charge on the support surface to hold the insulator-type substrate. The method also includes generating a plasma in exposure to the insulator-type substrate. The method also includes applying a pulsed clamping voltage to the electrode within the substrate support structure. The pulsed clamping voltage transitions between a set pulse voltage and an off-state voltage.

In an example embodiment, a system for holding an insulator-type substrate in exposure to a plasma is disclosed. The system includes a substrate support structure having a support surface configured to receive the insulator-type substrate. The substrate support structure includes an electrode. The substrate support structure also includes an upper conductive region formed between the electrode and the support surface. The upper conductive region is formed as a ceramic material including an amount of electrically conductive dopant material defined to give the upper conductive region an RC time constant of less than or equal to about 20 seconds. The system also includes a power supply connected to the electrode of the substrate support structure. The power supply is configured to supply a clamping voltage to the electrode. The system also includes a control system configured to direct the power supply to supply the clamping voltage to the electrode in either a step-wise manner or a pulsed manner to accumulate and maintain just enough electrical charge on the support surface of the substrate support structure to securely hold the insulator-type substrate in exposure to the plasma.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
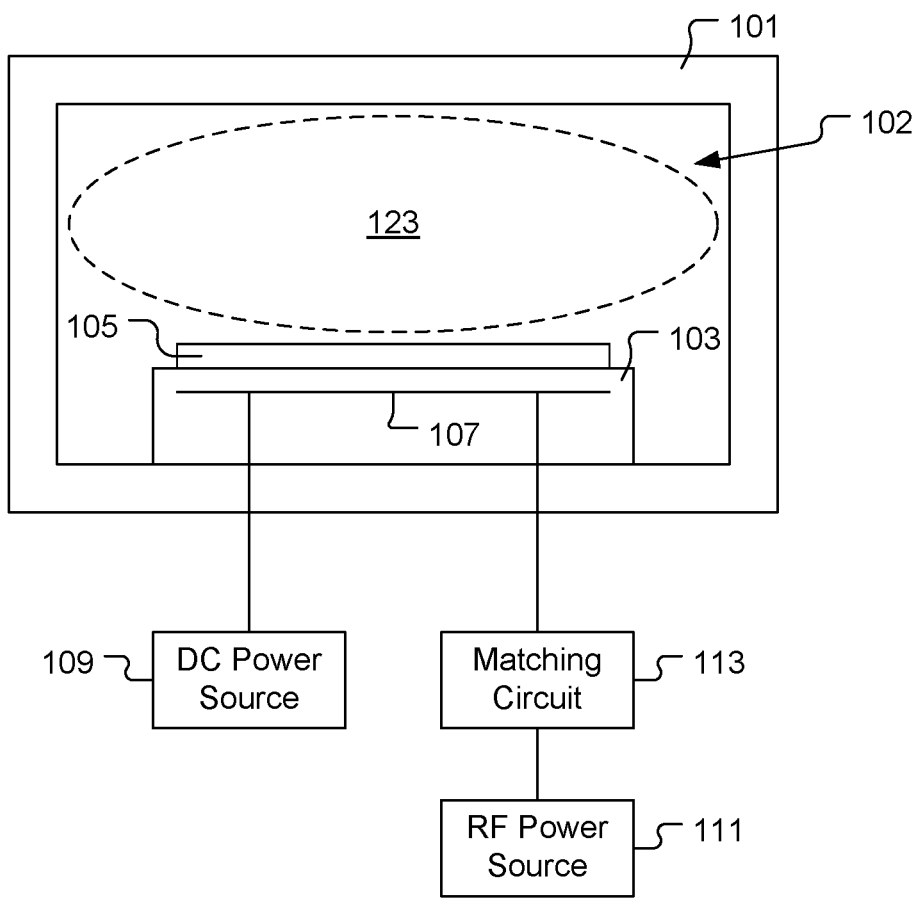
FIG. 1 shows an example vertical cross-section diagram of a plasma processing chamber, in accordance with some embodiments of the present invention.

In the semiconductor industry, semiconductor substrates can undergo fabrication operations in various types of plasma chambers, such as capacitively coupled plasma (CCP) processing chambers and inductively coupled plasma (ICP) plasma processing chambers. FIG. 1 shows an example vertical cross-section diagram of a plasma processing chamber 101, in accordance with some embodiments of the present invention. The plasma processing chamber 101 defines a processing volume 102 within which a plasma 123 is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material 105 present on the substrate 105.

In the embodiments disclosed herein, the substrate 105 is an insulator-type substrate 105 undergoing a fabrication procedure. It should be understood that the substrate 105 can be essentially any type of insulator-type substrate 105 that is subjected to a plasma-based fabrication process. For example, in some embodiments, the substrate 105 can refer to substrates formed of sapphire, GaN, GaAs or SiC, or other substrate materials, and can include glass panels/substrates, polymer materials, or the like. Also, in various embodiments, the substrate 105 as referred to herein may vary in form, shape, and/or size. For example, in some embodiments, the substrate 105 referred to herein may be a wafer having a 200 mm (millimeters) diameter, a 300 mm diameter, or a 450 mm diameter. Also, in some embodiments, the substrate 105 referred to herein may correspond to a non-circular substrate, such as a rectangular substrate for a flat panel display, or the like, among other shapes.

In various embodiments, the plasma processing chamber 101 operates by flowing one or more process gases into the processing volume 102, and by applying radiofrequency power to the one or more process gases to transform the one or more process gases into the plasma 123 in exposure to the substrate 105, in order to affect a change in material or surface condition on the substrate 105. The plasma processing chamber 101 includes a substrate support structure 103 upon which the substrate 105 is positioned and supported during processing operations.

In some embodiments, the substrate support structure 103 is an electrostatic-type substrate support structure 103, including one or more clamp electrode(s) 107 that are electrically powered to generate an electrostatic field for holding the substrate 105 on the substrate support structure 103. In some embodiments, the one or more clamp electrode(s) 107 are formed of tungsten. However, in other embodiments, the one or more clamp electrode(s) 107 can be formed of another type of electrically conductive material that is suitable for generating an electrostatic field when supplied with direct current power and/or radiofrequency power. In some embodiments, the one or more clamp electrode(s) 107 can be connected to receive electrical power from a direct current (DC) clamping power source 109 and/or from a radiofrequency (RF) clamping power source 111 by way of a corresponding impedance matching circuit 113. The impedance matching circuit 113 includes an arrangement of capacitors and/or inductors configured to ensure that an impedance seen by the radiofrequency clamping power source 111 is sufficiently close to a load impedance for which the radiofrequency clamping power source 111 is designed to operate, so that radiofrequency signals generated and transmitted by the radiofrequency clamping power source 111 will be transmitted in an efficient manner without unacceptable reflection. It should be understood that both the direct current clamping power source 109 and the radiofrequency clamping power source 111 are configured to generate a voltage on the one or more clamp electrode(s) 107, which in turn generates the electrostatic field for holding the substrate 105 on the substrate support structure 103. In various embodiments, the voltage generated on the one or more clamp electrode(s) 107 can either be a positive voltage or a negative voltage, depending on which polarity is needed to attract the substrate 105 during plasma processing operations.

Figure 2A:
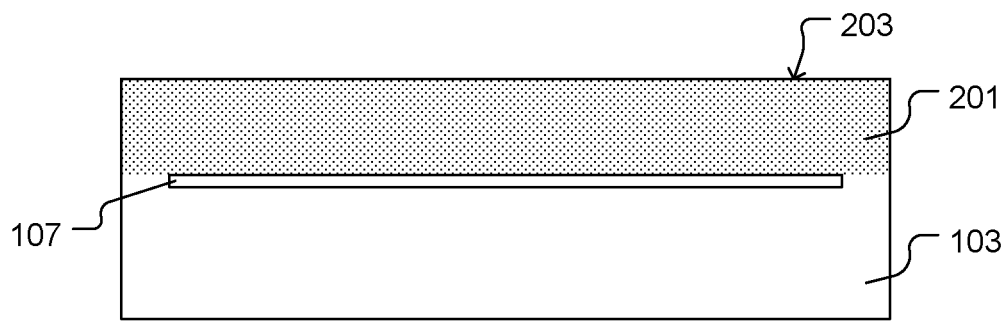
FIG. 2A shows an example vertical cross-section diagram of the substrate support structure, in accordance with some embodiments of the present invention.

FIG. 2A shows an example vertical cross-section diagram of the substrate support structure 103, in accordance with some embodiments of the present invention. In some embodiments, the substrate support structure 103 is formed of a ceramic material and includes an upper conductive region 201 formed between the clamp electrode(s) 107 and a top support surface 203 of the substrate support structure 103. The upper conductive region 201 can be referred to as a ceramic conductive layer. In some embodiments, the ceramic material within the upper conductive region 201 is doped with material that can serve as charge carriers, e.g., metallic material. Therefore, the electrical resistance of the upper conductive region 201 can be designed and controlled to obtain a particular electrical performance, such as a particular rate of electrical charge recombination within the upper conductive region 201, which can in turn provide control of a time required to release the substrate 105 from the substrate support structure 103 upon completion of the plasma processing. For example, in some embodiments, the upper conductive region 201 can be doped more heavily with electrically conductive dopant material to provide for faster charge recombination and for corresponding faster release of the substrate 105 from the substrate support structure 103 upon completion of the plasma processing.

With the upper conductive region 201 formed within the substrate support structure 103 between the clamp electrode(s) 107 and the top support surface 203, the substrate support structure 103 is configured to operate in accordance with the so called Johnsen-Rahbek effect. More specifically, by applying voltage to the clamp electrode(s) 107, an electrical charge is induced on the top support surface 203 of the substrate support structure 103. A polarity of the electrical charge induced on the top support surface 203 is controlled to be opposite of a polarity of electrical charge that accumulates in the substrate 105 during its exposure to the plasma 123, which causes an electrostatic attraction between the substrate 105 and the top support surface 203, and correspondingly establishes a holding force between the substrate 105 and the top support surface 203.

Figure 2B:
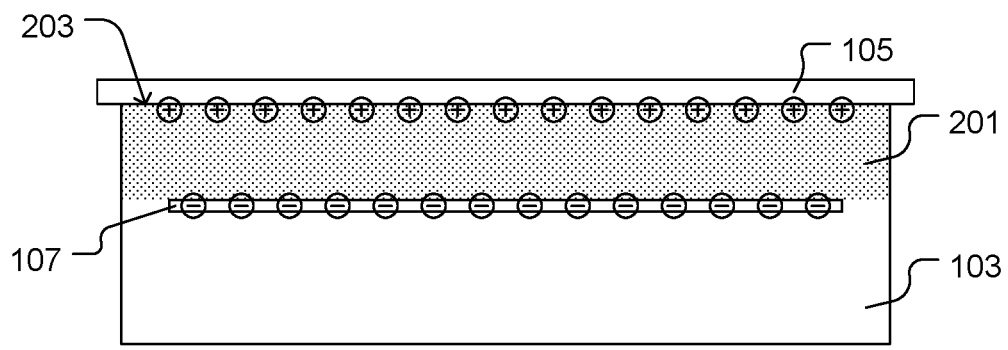
FIG. 2B shows the vertical cross-section diagram of the substrate support structure of FIG. 2A, with the substrate present on the top support surface and with a negative voltage applied to the clamp electrode(s), in accordance with some embodiments of the present invention.
Figure 2C:
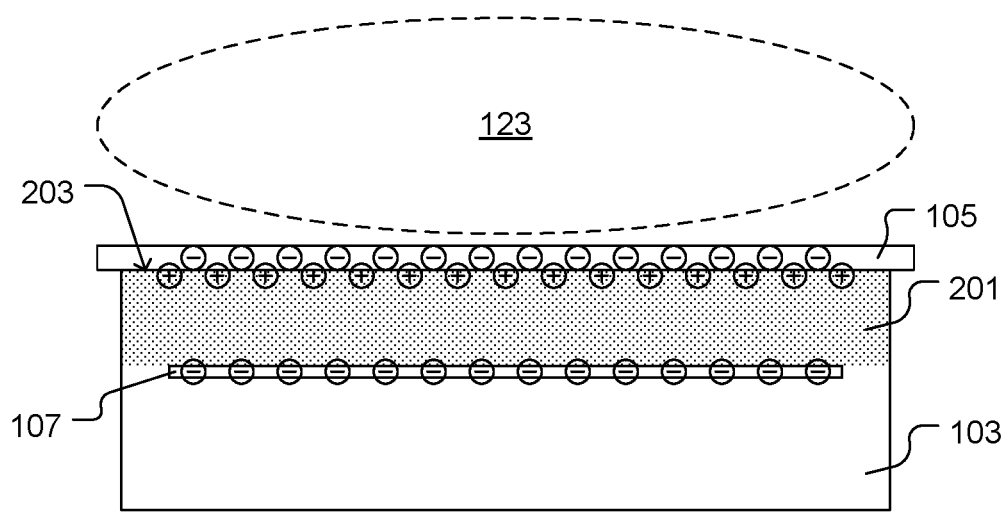
FIG. 2C shows the vertical cross-section diagram of the substrate support structure with the substrate present thereon of FIG. 2B, with the negative voltage applied to the clamp electrode(s) and with the plasma generated in exposure to the substrate, in accordance with some embodiments of the present invention.

FIG. 2B shows the vertical cross-section diagram of the substrate support structure 103 of FIG. 2A, with the substrate 105 present on the top support surface 203 and with a negative voltage applied to the clamp electrode(s) 107, in accordance with some embodiments of the present invention. FIG. 2C shows the vertical cross-section diagram of the substrate support structure 103 with the substrate 105 present thereon of FIG. 2B, with the negative voltage applied to the clamp electrode(s) 107 and with the plasma 123 generated in exposure to the substrate 105, in accordance with some embodiments of the present invention. Application of the negative voltage to the clamp electrode(s) 107 causes formation of a positive charge on the top support surface 203 of the upper conductive region 201. Also, because the substrate 105 is an insulator-type substrate 105, the exposure of the substrate 105 to the plasma 123 will cause an accumulation of charge within the substrate 105 (negative charge in this example) as the plasma process proceeds. The electrostatic attraction between the negatively charged substrate 105 and the positively charged top support surface 203 establishes the holding force between the substrate 105 and the top support surface 203. It should be understood that with a properly doped upper conductive region 201, the positive charge can be established on the top support surface 203 even during low temperature plasma process operations.

Also, in some embodiments where the substrate 105 accumulates a positive electrical charge during the plasma process, a positive voltage can be applied to the clamp electrode(s) 107 to establish a negative charge on the top support surface 203. In these embodiments, the complementary electrical charges on the substrate 105 and the top support surface 203 will establish the holding force between the substrate 105 and the top support surface 203. In some embodiments, supplying positive voltage to the clamp electrode(s) 107 can require supply of higher voltage. Therefore, when supplying positive voltage to the clamp electrode(s) 107, consideration is given to the possibility of electrical breakdown within the substrate support structure 103, and particularly within the upper conductive region 201.

It should be understood that because the substrate 105 is formed of an electrically insulating material, the substrate 105 will naturally retain its electrical charge upon completion of the plasma processing. Therefore, the substrate 105 cannot be relied upon to quickly release its electrical charge in order to facilitate timely release of the substrate 105 from the top support surface 203 of the substrate support structure 103. Some attempts have been made to enable electrical discharging of the substrate 105 by depositing an electrically conductive material on the backside of the substrate 105 that is in contact with the top support surface 203 of the substrate support structure 103, prior to subjecting the substrate 105 to the plasma processing. However, it should be appreciated that such deposition of electrically conductive material on the backside of the substrate 105 increases both the cost and complexity of the electronic device manufacturing process. Also, in some cases, deposition of electrically conductive material on the backside of the substrate 105 can adversely affect the luminescent efficiency of the electronic devices formed on the substrate 105, which can be particularly problematic when manufacturing light emitting diode devices, or similar types of luminescent-dependent electronic devices.

Additionally, as an alternative to the deposition of electrically conductive material on the backside of the substrate 105, some attempts have been made to reduce the time required for release of the substrate 105 from the top support surface 203 by increasing the temperature of the substrate support structure 103 to very high temperature, e.g., around 500° C. or greater, to enhance electrical charge dissipation and recombination. However, it should be recognized that many electronic devices and substrate 105 features cannot withstand exposure to such high temperature. Additionally, the time required for safe release of the substrate 105 from the top support surface 203 can be on the order of several minutes even in the presence of very high temperature, which can clearly have an adverse effect on fabrication throughput. In addition to the application of high-temperature, some other approaches for accelerating release of the substrate 105 involve application of a very high voltage of reversed polarity to the clamp electrode(s) 107, i.e., application of a polarity that is opposite of the clamping voltage polarity. However, application of the very high voltage of reverse polarity may damage the electronic devices formed on the substrate 105 and/or to the substrate support structure 103.

Given the foregoing, it should be appreciated that relying on electrical discharge of the insulator substrate 105 to obtain release of the substrate 105 from the top support surface 203 of the substrate support structure 103 can be inefficient, costly, and problematic. Upon completion of the plasma process, the time required for release of the substrate 105 from the top support surface 203 is primarily governed by the RC constant of the upper conductive region 201, which is a function of the dopant concentration, i.e., charge carrier concentration, within the upper conductive region 201. In some embodiments, it can take several minutes for the charge present on the top support surface 203 to dissipate and/or recombine through the upper conductive region 201 to allow for release of the substrate 105. Therefore, with regard to use of the electrostatic-type substrate support structure 103, it should be appreciated that insulator-type substrate 105 sticking issues are driven primarily by the time required for charge dissipation and/or recombination within the substrate support structure 103.

Because charge will accumulate at the top support surface 103 whenever voltage is applied to the clamp electrode(s) 107, application of a constant voltage to the clamp electrode(s) 107 during an entirety of the plasma process causes the charge on the top support surface 203 to accumulate during the entirety of the plasma process, to the point where the charge on the top support surface 203 is much greater that what is necessary to securely hold the substrate 105 to the top support surface 203. In this instance, the excess charge on the top support surface 203 at the end of the plasma process unnecessarily extends the time required for charge dissipation and/or recombination to allow for release of the substrate 105 from the top support surface 203.

The embodiments disclosed herein serve to reduce the time required for release of the substrate 105 from the top support surface 203 of the substrate support structure 103 by controlling an amount of electrical charge accumulation on the top support surface 203 to be just enough for establishing and maintaining an adequate holding force between the substrate 105 and the top support surface 203. This approach serves to reduce and minimize the amount of charge dissipation and/or recombination through the upper conductive region 201 that is required upon completion of the plasma process to obtain release of the substrate 105.

Figure 3:
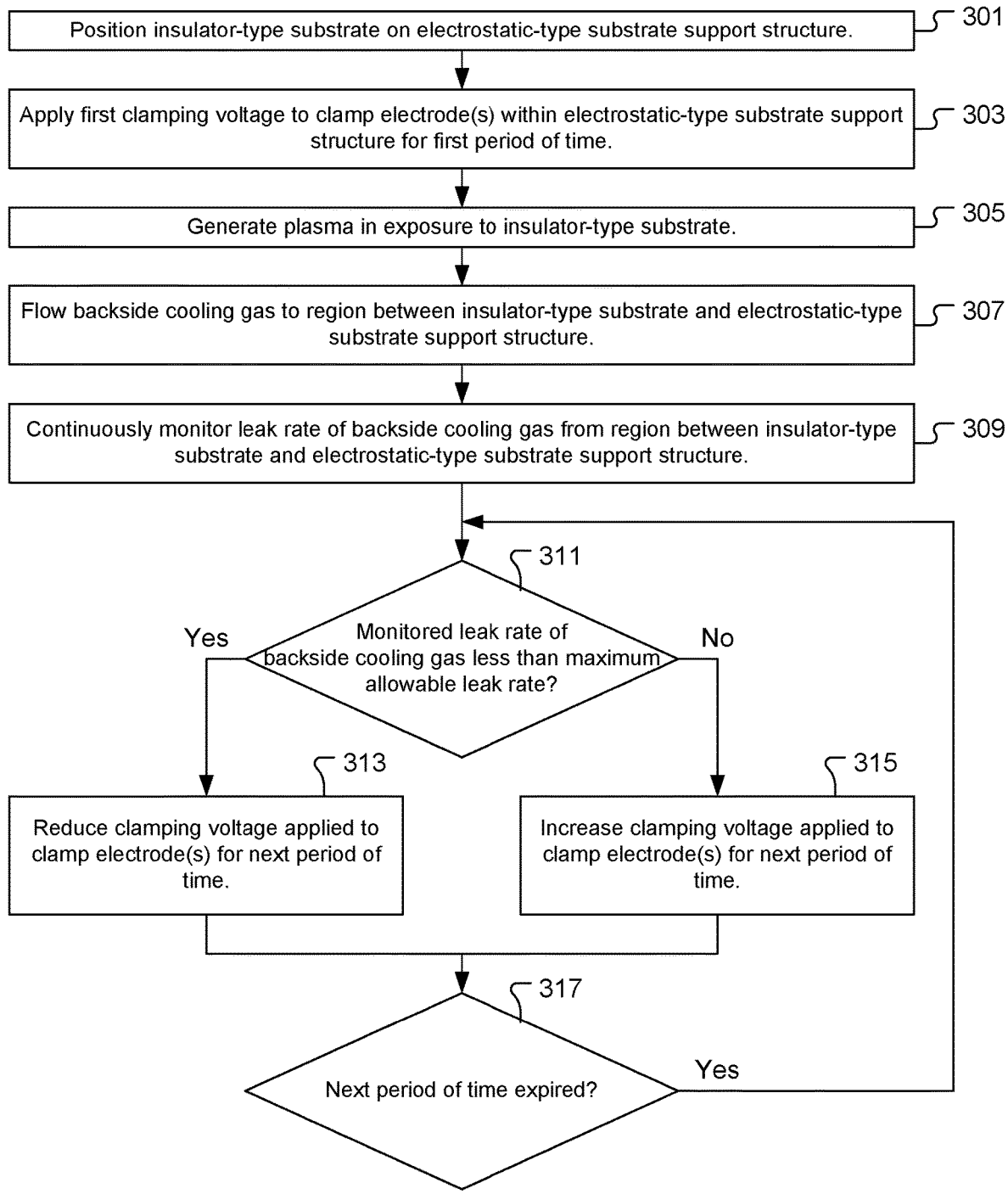
FIG. 3 shows a method for controlling a clamping voltage applied to an electrostatic-type substrate support structure in a step-wise manner for holding an insulator-type substrate, in accordance with some embodiments of the present invention.

FIG. 3 shows a method for controlling a clamping voltage applied to an electrostatic-type substrate support structure in a step-wise manner for holding an insulator-type substrate, in accordance with some embodiments of the present invention. The method of FIG. 3 includes reduction of the applied clamping voltage in a step-wise manner to minimize the amount of charge dissipation and/or recombination through the upper conductive region 201 of the substrate support structure 103 that is required upon completion of the plasma process so as to obtain faster release of the substrate 105 from the top support surface 203. The amount of charge dissipation and/or recombination through the upper conductive region 201 of the substrate support structure 103 that is required upon completion of the plasma process in order to obtain release of the substrate 105 from the top support surface 203 can be referred to as the "charge separation distance." With this, the method of FIG. 3 serves to minimize the charge separation distance to provide for more rapid release, i.e., de-chucking, of the substrate 105 upon completion of the plasma process. In other words, the method of FIG. 3 serves to keep the accumulation of charge on the top support surface 203 of the substrate support structure 103 at a level that is just enough to provide a minimum required holding force between the substrate 105 and the top support surface 203, so as to minimize the time required for release of the substrate 105.

The method includes an operation 301 for positioning the insulator-type substrate 105 on the electrostatic-type substrate support structure 103. The method also includes an operation 303 for applying a first clamping voltage to the clamp electrode(s) 107 within the substrate support structure 103 for a first period of time. The first clamping voltage is set to quickly establish a minimum required holding force at the top support surface 203 of the substrate support structure 103. The first clamping voltage is set to quickly accumulate charge at the top support surface 203. Also, the first period of time is set to ensure that the amount of charge that quickly accumulates at the top support surface 203 does not significantly exceed an amount of charge needed to establish the minimum required holding force at the top support surface 203.

In some embodiments, the first clamping voltage is set within a range extending from about −100 V (volts) to about −10000 V. In some embodiments, the first clamping voltage is set within a range extending from about +100 V to about +10000 V. In some embodiments, the first clamping voltage is set within a range extending from about −1000 V to about −10000 V. In some embodiments, the first clamping voltage is set within a range extending from about +1000 V to about +10000 V. In some embodiments, the first clamping voltage is set within a range extending from 0 V to about −6000 V. In some embodiments, the first clamping voltage is set within a range extending from 0 V to about +6000 V. In some embodiments, the first clamping voltage has an absolute value of up to 20000 V. In some embodiments, the first clamping voltage is set at about −20000 V. In some embodiments, the first clamping voltage is set at about +20000 V. As used herein, the phrase "about" a given value means within plus or minus 10% of the given value.

The method also includes an operation 305 for generating the plasma 123 in exposure to the substrate 105. In various embodiments, the plasma 123 will cause a charge to accumulate in the insulator-type substrate 105. For discussion purposes, we will consider that a negative charge accumulates in the substrate 105 while it is in exposure to the plasma 123. The method also includes an operation 307 for flowing a backside cooling gas to a region between the substrate 105 and the substrate support structure 103. In some embodiments, the backside cooling gas is helium. However, in other embodiments, the backside cooling gas can be essentially any type of gas that is suitable for cooling of the substrate 105 and that is chemically compatible with the plasma process and the materials to which the backside cooling gas is exposed. In some embodiments, the backside cooling gas is applied at a pressure within a range extending from about 1 Torr to about 20 Torr. In some embodiments, the backside cooling gas is applied at a pressure greater than about 20 Torr. In some embodiments, the backside cooling gas is applied at a flow rate within a range extending from about 0.5 sccm (standard cubic centimeters per minute) to about 50 sccm. In some embodiments, the backside cooling gas is applied at a flow rate less than about 0.5 sccm. In some embodiments, the backside cooling gas is applied at a flow rate greater than about 20 sccm.

It should be understood that in various embodiments any of the operations 301 through 307 can be performed in different orders and/or simultaneously. The method also includes an operation 309 for continuously monitoring a leak rate of the backside cooling gas from the region between the substrate 105 and the substrate support structure 103. More specifically, the leak rate of the backside cooling gas is continuously monitored as the plasma process is performed. The method includes an operation 311 for determining whether or not the monitored leak rate of the backside cooling gas is less than the maximum allowable leak rate. It should be understood that the maximum allowable leak rate indicates adequate clamping of the substrate 105 to the top support surface 203 of the substrate support structure 103. Therefore, a leak rate of the backside cooling gas that exceeds the maximum allowable leak rate indicates that the substrate 105 is not adequately secured to the top support surface 203 of the substrate support structure 103. In some example embodiments, the maximum allowable leak rate is about 10 sccm. However, in other embodiments, the maximum allowable leak rate can be either greater than or less than about 10 sccm.

If the operation 311 determines that the monitored leak rate of the backside cooling gas is less than the maximum allowable leak rate, the method proceeds with an operation 313 for reducing the clamping voltage applied to the clamp electrode(s) 107 for a next period of time. In some embodiments, the amount by which the clamping voltage is reduced in the operation 313 can be within a range extending from about 1% to about 50% of the previously applied clamping voltage extant upon performance of the operation 313. In some embodiments, the amount by which the clamping voltage is reduced in the operation 313 can be within a range extending from about 10% to about 20% of the previously applied clamping voltage extant upon performance of the operation 313. Also, in various embodiments, as the monitored leak rate of the backside cooling gas more closely approaches the maximum allowable leak rate, the amount by which the clamping voltage is reduced in the operation 313 can be decreased so as to cause finer adjustment of the clamping voltage and correspondingly finer adjustment of the charge present at the top support surface 203 of the substrate support structure 103. From the operation 313, the method proceed with an operation 317 to determine whether or not the next period of time (for which the reduced clamping voltage was applied in the operation 313) has expired. If the operation 317 determines that the next period of time has expired, the method reverts back to 311.

Also, with reference back to operation 311, if it is determined that the monitored leak rate of the backside cooling gas is not less than the maximum allowable leak rate, the method proceeds with an operation 315 for increasing the clamping voltage applied to the clamp electrode(s) 107 for a next period of time. In some embodiments, the amount by which the clamping voltage is increased in the operation 315 can be within a range extending from about 1% to about 50% of the previously applied clamping voltage extant upon performance of the operation 315. In some embodiments, the amount by which the clamping voltage is increased in the operation 315 can be within a range extending from about 10% to about 20% of the previously applied clamping voltage extant upon performance of the operation 315. Also, in various embodiments, the amount by which the clamping voltage is increased in the operation 315 can be dependent upon how much the monitored leak rate of the backside cooling gas exceeds the maximum allowable leak rate. For example, if the monitored leak rate of the backside cooling gas is closer to the maximum allowable leak rate, the amount by which the clamping voltage is increased in the operation 313 can be smaller as compared to when the monitored leak rate of the backside cooling gas is farther beyond the maximum allowable leak rate. From the operation 315, the method proceeds with the operation 317 to determine whether or not the next period of time (for which the increased clamping voltage was applied in the operation 315) has expired. Again, if the operation 317 determines that the next period of time has expired, the method reverts back to 311. In some embodiments, the clamping voltage reduction schedule (amount of voltage reduction and duration of the next period of time) for operation 313 and the clamping voltage increase schedule (amount of voltage increase and duration of the next period of time) for operation 315 can be recipe parameters, i.e., set as part of the plasma process recipe.

In some embodiments, the method of FIG. 3 can include an operation for applying a release voltage of reverse polarity to the clamp electrode(s) 107 upon completion of the plasma process. For example, if the clamping voltage is of negative polarity, a release voltage of positive polarity can be applied to the clamp electrode(s) 107 upon completion of the plasma process to accelerate release of the substrate 105 from the top support surface 203 of the substrate support structure 103. It should be appreciated that by using the step-wise adjustment in clamping voltage provided by the method of FIG. 3, it is possible to reduce the amount of time required for release of the substrate 105 from the top support surface 203 of the substrate support structure 103, which corresponds directly to a reduction in the amount of time that the release voltage of reverse polarity is applied. Also, it should be appreciated that by using the step-wise adjustment in clamping voltage provided by the method of FIG. 3, it is possible to reduce the absolute value of the release voltage of reverse polarity applied to accelerate release of the substrate 105 from the top support surface 203 of the substrate support structure 103, which helps reduce the potential for damage to the electronic devices formed on the substrate 105 and/or to the substrate support structure 103 due to application of the release voltage of reverse polarity.

Figure 4:
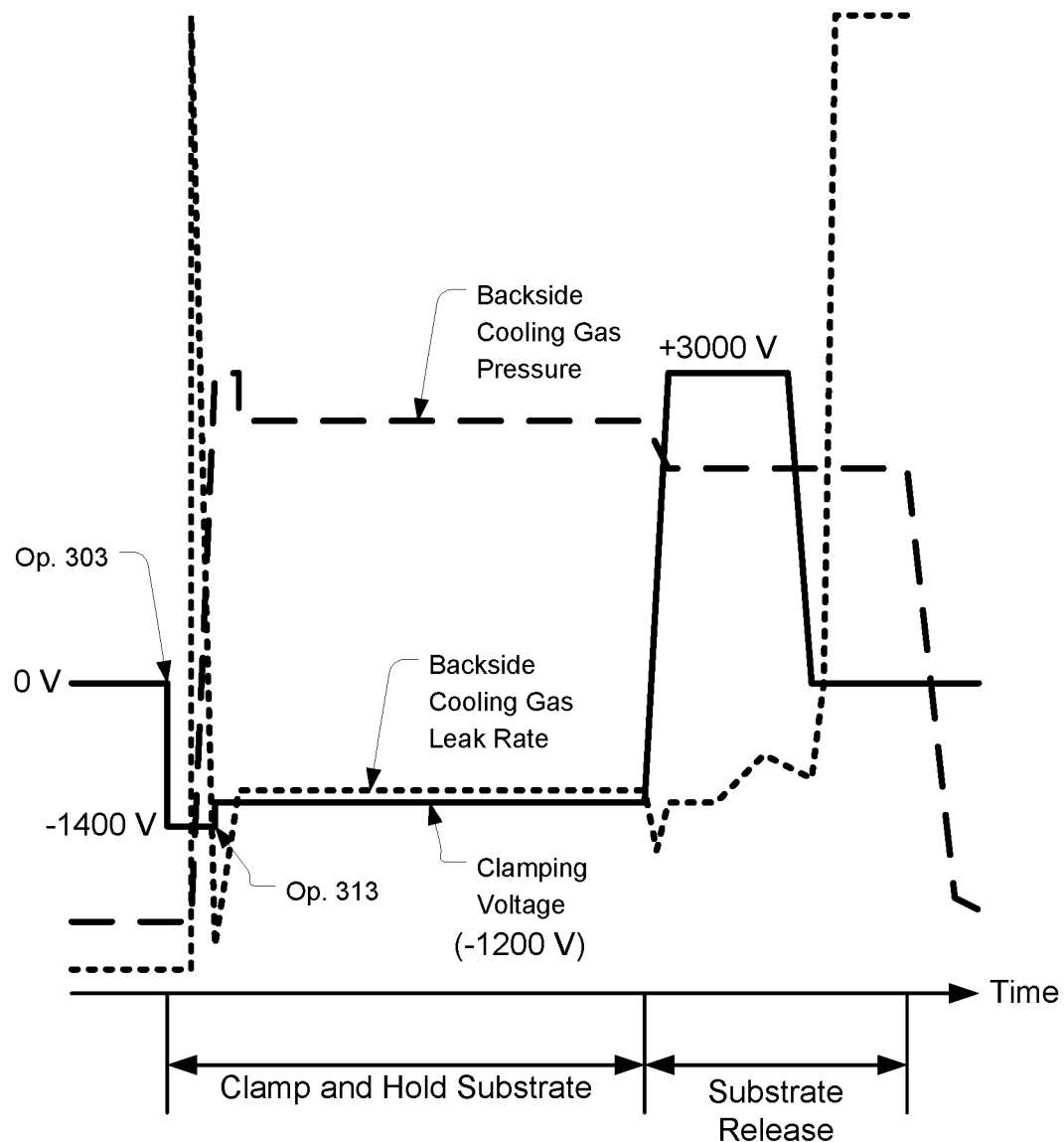
FIG. 4 shows an example chart of backside cooling gas leak rate, backside cooling gas pressure, and clamping voltage during a plasma process in which the method of FIG. 3 is applied, in accordance with some embodiments of the present invention.

FIG. 4 shows an example chart of backside cooling gas leak rate, backside cooling gas pressure, and clamping voltage during a plasma process in which the method of FIG. 3 is applied, in accordance with some embodiments of the present invention. The chart shows that upon performing operation 303, a clamping voltage of −1400 V is applied to the clamp electrode(s) 107 for the first period of time. Then, the chart shows that upon performing the operation 313, the clamping voltage is reduced by about 15% to −1200 V. In this particular example, the backside cooling gas leak rate remains substantially steady at about 8.5 sccm when the clamping voltage of −1200 V is applied. Similarly, the backside cooling pressure remains substantially steady at about 8 Torr when the clamping voltage of −1200 V is applied. Also, in this particular example, the next period of time for application of the clamping voltage of −1200 V extends through the end of the plasma process. Also, the chart shows that a release voltage of reverse polarity of about +3000 V is applied to the clamp electrode(s) 107 to release the substrate 105. It should be understood that the backside cooling gas leak rates, backside cooling gas pressures, clamping voltages, and release voltage shown in the example chart of FIG. 4 are provided by way of example and are in no way limiting.

The method of FIG. 3 demonstrates that by implementing a step-wise adjustment in clamping voltage, it is possible to quickly establish a substrate 105 holding force. Then, during the remainder of the plasma process, a minimum accumulation of charge on the top support surface 203 is reached and maintained so that the substrate 105 does not inadvertently release from the top support surface 203 of the substrate support structure 103. Therefore, it should be understood that the method of FIG. 3 provides for 1) quickly accumulating charge at the top support surface 203 of the substrate support structure 103, and 2) avoiding accumulation of more charge at the top support surface 203 of the substrate support structure 103 than what is needed to keep the substrate 105 secured to the top support surface 203. In other words, the method of FIG. 3 serves to establish and maintain the lowest possible clamping voltage that allows for satisfying the maximum allowable backside cooling gas leak rate criteria. Therefore, the method of FIG. 3 effectively establishes and maintains a ceiling on the charge that is present at the top support surface 203 of the substrate support structure 103 during the plasma process, which results in minimization of the amount of charge dissipation and/or recombination through the upper conductive region 201 of the substrate support structure 103 that is required upon completion of the plasma process to obtain release of the substrate 105 from the top support surface 203. Also, as an added benefit, establishing and maintaining a ceiling on the charge that is present at the top support surface 203 of the substrate support structure 103 helps to protect the substrate support structure 103 and the clamping power supply from damage caused by excessive charge build up.

Figure 5:
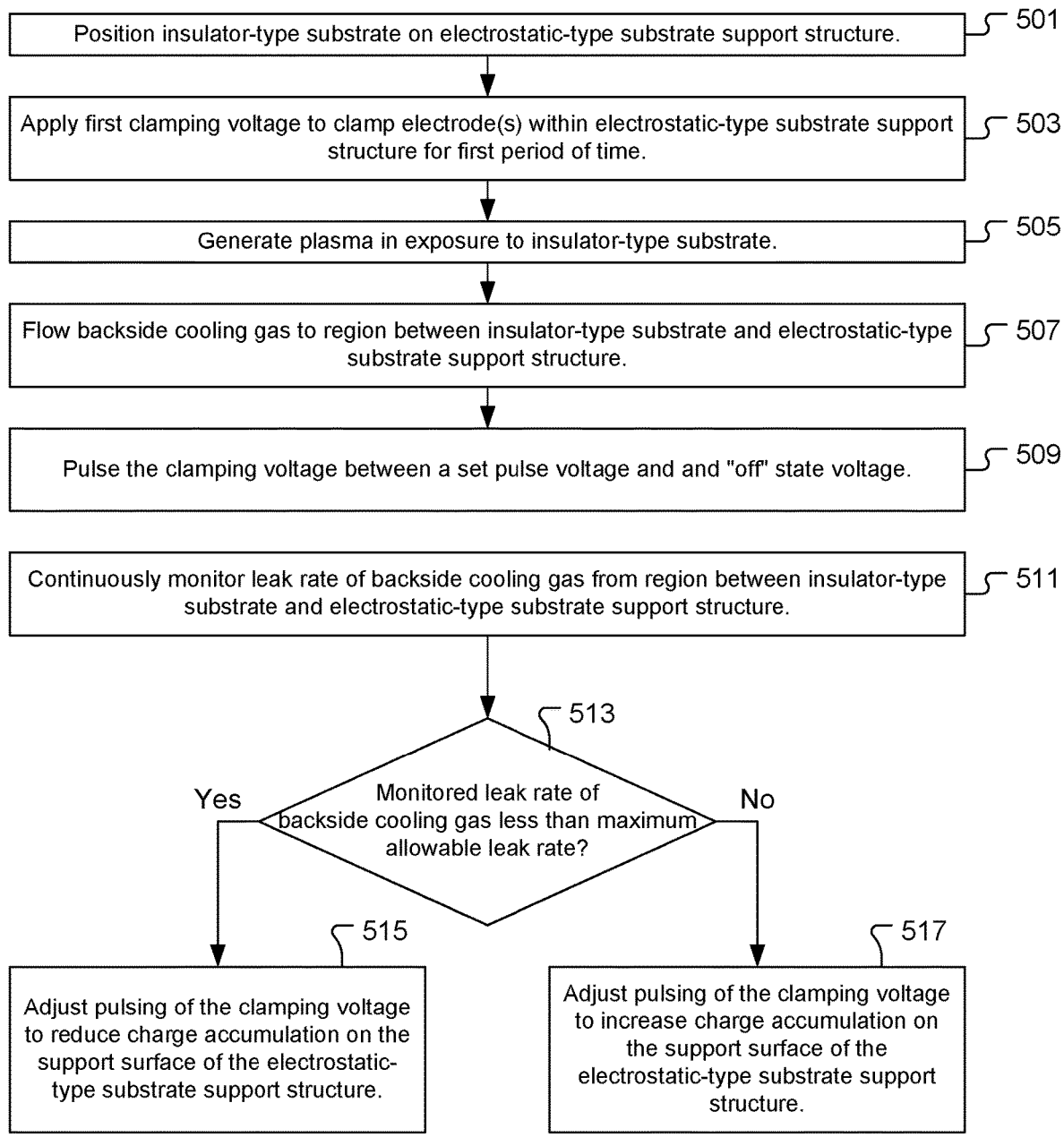
FIG. 5 shows a method for controlling a clamping voltage applied to an electrostatic-type substrate support structure in a pulsed manner for holding an insulator-type substrate, in accordance with some embodiments of the present invention.

FIG. 5 shows a method for controlling a clamping voltage applied to an electrostatic-type substrate support structure in a pulsed manner for holding an insulator-type substrate, in accordance with some embodiments of the present invention. The method of FIG. 5 includes application of the clamping voltage in a pulsed manner instead of a constant manner. More specifically, in the method of FIG. 5, the clamping voltage is pulsed between a set pulse voltage and an "off" state voltage. The polarity of the set pulse voltage can be either negative or positive, depending on the polarity of the charge on the substrate 105 during the plasma process, so that the polarity of the set pulse voltage induces charge on the top support surface 203 of the substrate support structure 103 that is of opposite polarity with respect to the charge accumulating on the substrate 105 during the plasma process. When the clamping voltage is at zero, no charge is accumulating on the top support surface 203 of the substrate support structure 103, and charge that had previous accumulated on the top support surface 203 is allowed to dissipate and recombine through the upper conductive region 201 of the substrate support structure 103. Therefore, the total time at which the clamping voltage is in the "off" state, i.e., at zero or near zero, during the pulsing of the clamping voltage serves to minimize the amount of charge dissipation and/or recombination through the upper conductive region 201 of the substrate support structure 103 that is required upon completion of the plasma process to obtain release of the substrate 105 from the top support surface 203.

The method of FIG. 5 begins with an operation 501 for positioning the insulator-type substrate 105 on the electrostatic-type substrate support structure 103. The method also includes an operation 503 for applying a first clamping voltage to the clamp electrode(s) 107 within the substrate support structure 103 for a first period of time. The first clamping voltage is set to quickly establish a minimum required holding force at the top support surface 203 of the substrate support structure 103. The first clamping voltage is set to quickly accumulate charge at the top support surface 203. Also, the first period of time is set to ensure that the amount of charge that quickly accumulates at the top support surface 203 does not significantly exceed an amount of charge needed to establish the minimum required holding force at the top support surface 203.

In some embodiments, the first clamping voltage is set within a range extending from about −100 V to about −10000 V. In some embodiments, the first clamping voltage is set within a range extending from about +100 V to about +10000 V. In some embodiments, the first clamping voltage is set within a range extending from about −1000 V to about −10000 V. In some embodiments, the first clamping voltage is set within a range extending from about +1000 V to about +10000 V. In some embodiments, the first clamping voltage is set within a range extending from 0 V to about −6000 V. In some embodiments, the first clamping voltage is set within a range extending from 0 V to about +6000 V. In some embodiments, the first clamping voltage has an absolute value of up to 20000 V. In some embodiments, the first clamping voltage is set at about −20000 V. In some embodiments, the first clamping voltage is set at about +20000 V. In some embodiments, the first clamping voltage is set at about −700 V. In some embodiments, the first clamping voltage is set at about +700 V.

The method also includes an operation 505 for generating the plasma 123 in exposure to the substrate 105. In various embodiments, the plasma 123 will cause a charge to accumulate in the insulator-type substrate 105. For discussion purposes, some example embodiments disclosed herein consider that a negative charge accumulates in the substrate 105 while it is in exposure to the plasma 123. However, it should be understood that in some embodiments, a condition of the substrate 105 and the plasma 123 can cause positive charge to accumulate in the substrate 105.

The method also includes an operation 507 for flowing a backside cooling gas to a region between the substrate 105 and the substrate support structure 103. In some embodiments, the backside cooling gas is helium. However, in other embodiments, the backside cooling gas can be essentially any type of gas that suitable for cooling of the substrate 105 and that is chemically compatible with the plasma process and the materials to which the backside cooling gas is exposed. In some embodiments, the backside cooling gas is applied a pressure within a range extending from about 1 Torr to about 20 Torr. In some embodiments, the backside cooling gas is applied a pressure greater than about 20 Torr. In some embodiments, the backside cooling gas is applied at a flow rate within a range extending from about 0.5 sccm to about 50 sccm. In some embodiments, the backside cooling gas is applied at a flow rate less than about 0.5 sccm. In some embodiments, the backside cooling gas is applied at a flow rate greater than about 20 sccm. It should be understood that in various embodiments any of the operations 501 through 507 can be performed in different orders and/or simultaneously.

The method also includes an operation 509 for pulsing of the clamping voltage between a set pulse voltage and an "off" state voltage after completion of the first period of time during which the first clamping voltage is applied in the operation 503. In some embodiments, the "off" state of the clamping voltage is zero. In some embodiments, the "off" state of the clamping voltage can have a small non-zero absolute value. In some embodiments, the pulsing of the clamping voltage in operation 509 can be preceded by a second period of time during which the clamping voltage is held at the set pulse voltage. For example, in some embodiments, the second period of time during which the clamping voltage is held at the set pulse voltage before commencing pulsing of the clamping voltage can be a non-zero time extending up to about 300 seconds. In some embodiments, the second period of time during which the clamping voltage is held at the set pulse voltage before commencing pulsing of the clamping voltage is about 10 seconds. In some embodiments, the second period of time during which the clamping voltage is held at the set pulse voltage before commencing pulsing of the clamping voltage can be a function of the rate at which charge accumulates on the substrate 105 and/or on the top support surface 203 of the substrate support structure 103. For example, in some embodiments, the second period of time during which the clamping voltage is held at the set pulse voltage before commencing pulsing of the clamping voltage can be a percentage of the plasma processing recipe step time.

Once the operation 509 begins, the clamping voltage is pulsed between the set pulse voltage and the "off" state voltage. During the pulsing of the clamping voltage, the duration of a given pulse at the set pulse voltage can be controlled as a process parameter and be adjusted over time. For example, in some embodiments, the duration of a given pulse at the set pulse voltage can be within a range extending from about 1 second to about 60 seconds. Also, in some embodiments, the duration of a given pulse at the set pulse voltage can be controlled as a percentage of the duration of the plasma process recipe step. For example, if the duration of the plasma process recipe step is 5 seconds, then the duration of a given pulse at the set pulse voltage may be about 1 second. In another example, if the duration of the plasma process recipe step is 20 seconds, then the duration of a given pulse at the set pulse voltage may be about 4 seconds. In another example, if the duration of the plasma process recipe step is 10 minutes, then the duration of a given pulse at the set pulse voltage may be within a range extending from about 5 seconds to about 50 seconds. It should be understood that in other embodiments, the duration of a given pulse at the set pulse voltage can be different than the examples provided above.

Also, during the pulsing of the clamping voltage, the duration at which the clamping voltage is at the "off" state voltage between successive pulses can be controlled as a process parameter and be adjusted over time. For example, in some embodiments, the duration at which the clamping voltage is at the "off" state voltage between successive pulses can be controlled within a range extending from about 3 seconds to about 20 seconds. However, it should be understood that in other embodiments, the duration at which the clamping voltage is at the "off" state voltage between successive pulses can be either less than 3 seconds or greater than 20 seconds.

Also, the set pulse voltage can be controlled as process parameter and be adjusted over time. And, the clamping voltage that represents the "off" state can be controlled as process parameter and be adjusted over time. For example, in some embodiments, the clamping voltage that represents the "off" state can be zero in some embodiments. And, in other embodiments, the clamping voltage that represents the "off" state can be non-zero in some embodiments.

Different types of films and materials present on the substrate 105 can affect how the substrate 105 accumulates and/or retains charge, which can in turn influence how the pulsing of the clamping voltage should be controlled in operation 509. In some embodiments, settings of the process parameters for controlling the pulsing of the clamping voltage in operation 509 can be dependent upon a condition of the substrate 105 during the plasma process, and as such can be controlled in accordance with the plasma processing recipe that is performed on the substrate 105.

The method also includes an operation 511 for continuously monitoring a leak rate of the backside cooling gas from the region between the substrate 105 and the substrate support structure 103. More specifically, the leak rate of the backside cooling gas is continuously monitored as the plasma process is performed. The method also includes an operation 513 for determining whether or not the monitored leak rate of the backside cooling gas is less than the maximum allowable leak rate. It should be understood that the maximum allowable leak rate indicates adequate clamping of the substrate 105 to the top support surface 203 of the substrate support structure 103. Therefore, a leak rate of the backside cooling gas that exceeds the maximum allowable leak rate indicates that the substrate 105 is not adequately secured to the top support surface 203 of the substrate support structure 103. In some example embodiments, the maximum allowable leak rate is about 10 sccm. However, in other embodiments, the maximum allowable leak rate can be either greater than or less than about 10 sccm.

If the operation 513 determines that the monitored leak rate of the backside cooling gas is less than the maximum allowable leak rate, the method proceeds with an operation 515 for adjusting the pulsing of the clamping voltage to reduce the charge accumulation on the top support surface 203 of the substrate support structure 103. In various embodiments, the operation 515 can include one or more of a reduction in the level of the set pulse voltage, a shortening of the pulse duration, and/or a lengthening of the time between successive pulses. In some embodiments, the amount by which the level of the set pulse voltage is reduced in the operation 515 can be within a range extending from about 1% to about 50% of the previously applied level of the set pulse voltage. In some embodiments, the amount by which the level of the set pulse voltage is reduced in the operation 515 can be within a range extending from about 10% to about 20% of the previously applied level of the set pulse voltage. Also, in some embodiments, the amount by which the pulse duration is shortened in the operation 515 can be within a range extending from about 1% to about 50% of the previously applied pulse duration. In some embodiments, the amount by which the pulse duration is shortened in the operation 515 can be within a range extending from about 5% to about 20% of the previously applied pulse duration. Also, in various embodiments, the amount by which the length of time between successive pulses is lengthened in the operation 515 can be within a range extending from about 1% to about 50% of the previously applied length between successive pulses. In some embodiments, the amount by which the length of time between successive pulses is lengthened in the operation 515 can be within a range extending from about 5% to about 20% of the previously applied length between successive pulses.

Also, with reference back to operation 513, if it is determined that the monitored leak rate of the backside cooling gas is not less than the maximum allowable leak rate, the method proceeds with an operation 517 for adjusting the pulsing of the clamping voltage to increase the charge accumulation on the top support surface of the substrate support structure. In various embodiments, the operation 517 can include one or more of an increase in the level of the set pulse voltage, a lengthening of the pulse duration, and/or a shortening of the time between successive pulses. In some embodiments, the amount by which the level of the set pulse voltage is increased in the operation 517 can be within a range extending from about 1% to about 50% of the previously applied level of the set pulse voltage. In some embodiments, the amount by which the level of the set pulse voltage is increased in the operation 517 can be within a range extending from about 10% to about 20% of the previously applied level of the set pulse voltage. Also, in some embodiments, the amount by which the pulse duration is lengthened in the operation 517 can be within a range extending from about 1% to about 50% of the previously applied pulse duration. In some embodiments, the amount by which the pulse duration is lengthened in the operation 517 can be within a range extending from about 5% to about 20% of the previously applied pulse duration. Also, in some embodiments, the amount by which the length of time between successive pulses is shortened in the operation 517 can be within a range extending from about 1% to about 50% of the previously applied length between successive pulses. In some embodiments, the amount by which the length of time between successive pulses is shortened in the operation 517 can be within a range extending from about 5% to about 20% of the previously applied length between successive pulses. In some embodiments, the adjustment to the pulsing of the clamping voltage in operations 515 and 517 can be recipe parameters, i.e., part of the plasma process recipe.

Also, in some embodiments, the method of FIG. 5 can include an operation for applying a release voltage of reverse polarity to the clamp electrode(s) 107 upon completion of the plasma process. For example, if the clamping voltage is of negative polarity, a release voltage of positive polarity can be applied to the clamp electrode(s) 107 upon completion of the plasma process to accelerate release of the substrate 105 from the top support surface 203 of the substrate support structure 103. In an example embodiment, if the clamping voltage is of negative polarity, a release voltage of positive polarity of about +3000 V can be applied to the clamp electrode(s) 107 upon completion of the plasma process to accelerate release of the substrate 105 from the top support surface 203 of the substrate support structure 103. It should be understood that in other embodiments the release voltage of reverse polarity that is applied to the clamp electrode(s) 107 to accelerate release of the substrate 105 can have an absolute value of either less than or greater than 3000 V.

It should be appreciated that by using the pulsed clamping voltage in the method of FIG. 5, it is possible to reduce the amount of time required for release of the substrate 105 from the top support surface 203 of the substrate support structure 103, which corresponds directly to a reduction in the amount of time that the release voltage of reverse polarity is applied. Also, it should be appreciated that by using the pulsed clamping voltage in the method of FIG. 5, it is possible to reduce the absolute value of the release voltage of reverse polarity applied to accelerate release of the substrate 105 from the top support surface 203 of the substrate support structure 103.

During the plasma process, electrons from the plasma are consistently building up in the insulator substrate 105. Because the upper conductive region 201 of the substrate support structure 103 is a high-resistance conductive layer, the charge on the top support surface 203 of the substrate support structure 103 will not immediately recombine within the upper conductive region 201. This means that the charge accumulated on the top support surface 203 of the substrate support structure 103 will tend to persist. Therefore, the longer the clamping voltage is in the "off" state, the more time the accumulated charge on the top support surface 203 will have to dissipate and recombine within the upper conductive region 201 of the substrate support structure 103 as a function of the RC time constant of the upper conductive region 201. Given the foregoing, it should be appreciated that by pulsing the clamping voltage in the method of FIG. 5, more "off" time of the clamping voltage is provided to allow the accumulated charge on the top support surface 203 to dissipate and/or recombine, which serves to reduce the time required for release of the substrate 105 from the top support surface 203 upon completion of the plasma process.

The time required for charge dissipation and recombination from the top support surface 203 for release of the substrate 105 upon completion of the plasma process can be controlled in part by controlling the period of time during which the clamping voltage is held at the set pulse voltage prior to starting the pulsing of the clamping voltage in operation 509. This period of time during which the clamping voltage is held at the set pulse voltage prior to starting the pulsing of the clamping voltage allows the substrate 105 to accumulate some charge from the plasma, which ensures that the substrate 105 is secured well to the top support surface 203 when the clamping voltage goes to the "off" state upon pulsing of the clamping voltage. Also, as previously mentioned, the time required for charge dissipation and recombination from the top support surface 203 for release of the substrate 105 upon completion of the plasma process can also be controlled in part by adjusting the clamping voltage pulse parameters in operation 515, such as by adjusting the level of the set pulse voltage, adjusting the pulse duration, and/or adjusting the time between successive pulses.

Figure 6:
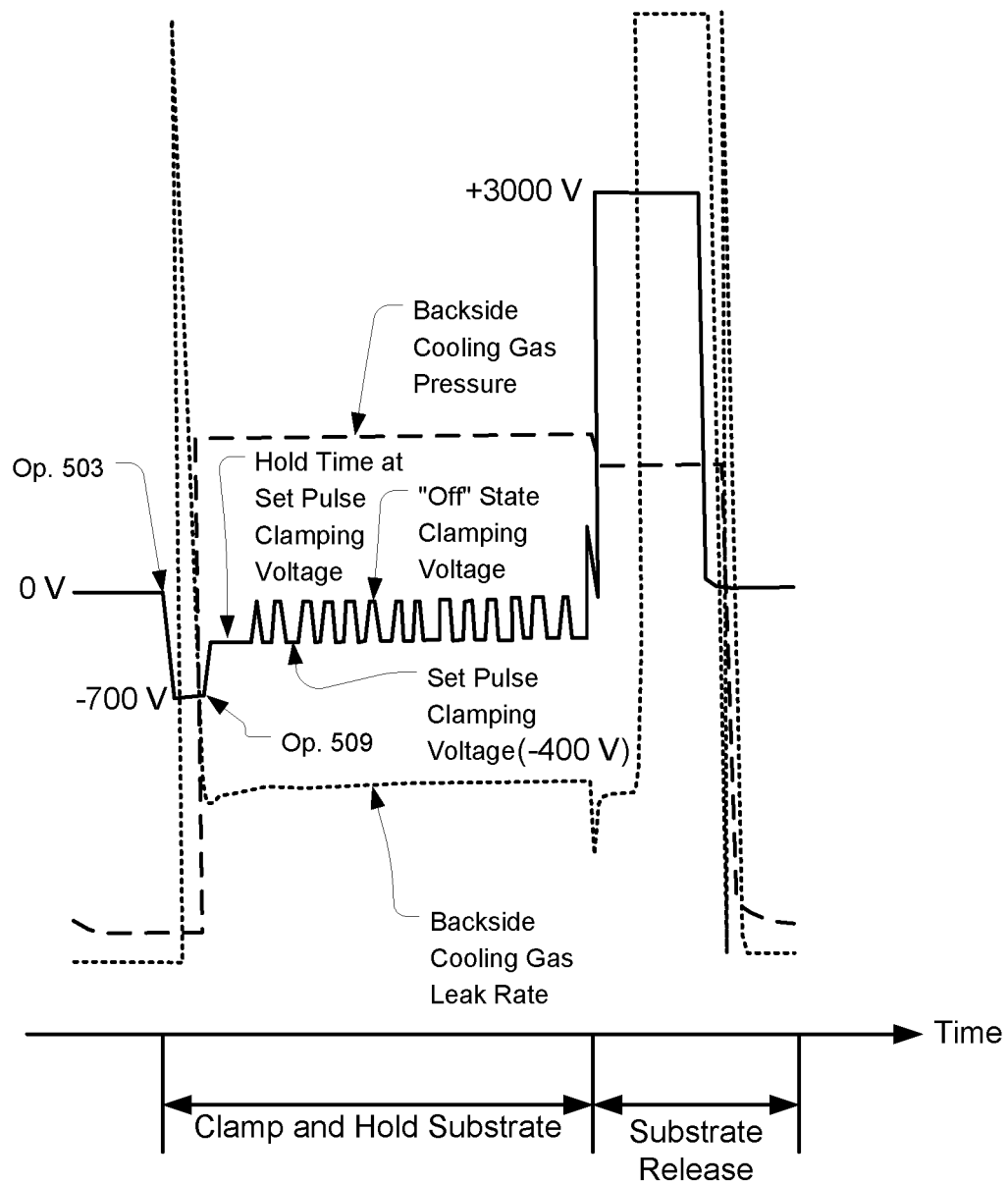
FIG. 6 shows an example chart of backside cooling gas leak rate, backside cooling gas pressure, and pulsed clamping voltage during a plasma process in which the method of FIG. 5 is applied, in accordance with some embodiments of the present invention.

FIG. 6 shows an example chart of backside cooling gas leak rate, backside cooling gas pressure, and pulsed clamping voltage during a plasma process in which the method of FIG. 5 is applied, in accordance with some embodiments of the present invention. The chart shows that upon performing operation 503, a clamping voltage of −700 V is applied to the clamp electrode(s) 107 for the first period of time. Then, the chart shows that upon performing the operation 509, the set pulse clamping voltage is held at about −400 V for a second period of time. Then, after this second period of time, the clamping voltage is pulsed between −400 V and about zero for the duration of the plasma process. In this example, the duration of each pulse of the clamping voltage at the set pulse voltage level of −400 V is about 4 seconds. Also, in this example, the time between successive pulses of the clamping voltage is about 4 seconds. In this particular example, the backside cooling gas leak rate remains substantially steady during pulsing of the clamping voltage. Similarly, the backside cooling pressure remains substantially steady during pulsing of the clamping voltage. Also, the chart shows that a release voltage of reverse polarity of about +3000 V is applied to the clamp electrode(s) 107 to release the substrate 105. It should be understood that the backside cooling gas leak rates, backside cooling gas pressures, clamping voltage pulsing schedule, and release voltage shown in the example chart of FIG. 6 are provided by way of example and are in no way limiting.

In some embodiments, the conductive material doping characteristics (and hence the electrical resistance) of the upper conductive region 201 of the substrate support structure 103 can be optimized for use with the methods of FIGS. 3 and 5 to provide for optimization of charge dissipation and recombination from the top support surface 203 of the substrate support structure 103. In some embodiments, the RC time constant of the upper conductive region 201 of the substrate support structure 103 for release of the substrate 105 from the top support surface 203 is about 20 seconds. However, in some embodiments, with increased conductive material doping of the upper conductive region 201, the RC time constant of the upper conductive region 201 of the substrate support structure 103 for release of the substrate 105 from the top support surface 203 can be reduced to about 5 seconds, or even less. The methods of FIGS. 3 and 5 allow the time required for release of the substrate 105 from the top support surface 203 to come into closer alignment with the RC time constant of the upper conductive region 201 of the substrate support structure 103. Therefore, by increasing the conductive material doping of the upper conductive region 201 in conjunction with controlling the clamping voltage in either a step-wise manner (FIG. 3) or pulsed manner (FIG. 5), it is possible to significantly reduce the time required for release of the insulator-type substrate 105 from the top support surface 203 of the electrostatic-type substrate support structure 103.

As disclosed herein, rapid release of the insulator-type substrate 105 from the top support surface 203 of the electrostatic-type substrate support structure 103 can be achieved by stepping down the clamping voltage over multiple process steps, such as in the method of FIG. 3, and/or by pulsing the clamping voltage to avoid excess charge buildup on the top support surface 203 of the substrate support structure 103, such as in the method of FIG. 5, while using just the plasma to dissipate charge from the insulator-type substrate 105. It should be understood that the methods disclosed herein are applicable to insulator-type substrates 105, either with or without conductive films present thereon, and whether patterned or blanket.

Figure 7:
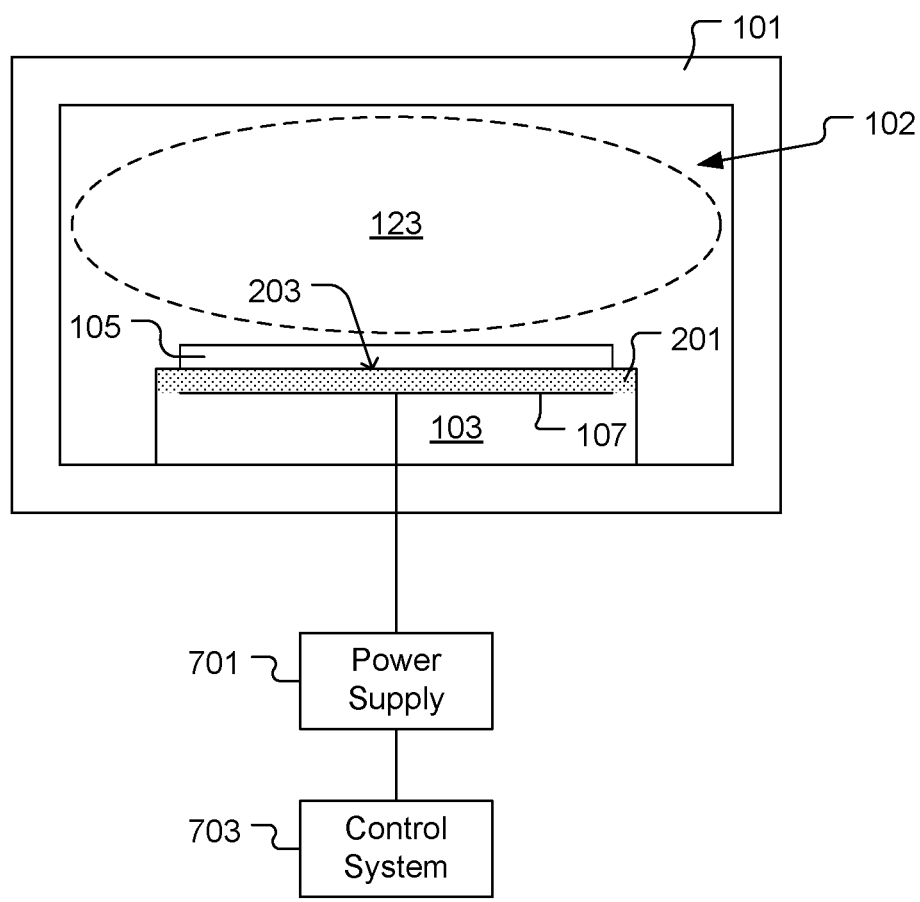
FIG. 7 shows a system for holding the insulator-type substrate in exposure to the plasma, in accordance with some embodiments of the present invention.

FIG. 7 shows a system for holding the insulator-type substrate 105 in exposure to the plasma 123, in accordance with some embodiments of the present invention. The system includes the substrate support structure 103 having the top support surface 203 configured to receive the insulator-type substrate 105. The substrate support structure 103 also includes the one or more electrode(s) 107. The substrate support structure 103 includes the upper conductive region 201 formed between the electrode(s) 107 and the top support surface 203. The upper conductive region 201 is formed as a ceramic material including an amount of electrically conductive dopant material defined to give the upper conductive region 201 an RC time constant of less than or equal to about 20 seconds. In some embodiments, the upper conductive region 201 is formed as a ceramic material including an amount of electrically conductive dopant material defined to give the upper conductive region 201 an RC time constant of less than or equal to about 5 seconds.

The system of FIG. 7 also includes a power supply 701 connected to the electrode(s) 107 of the substrate support structure 103. The power supply 701 is configured to supply a clamping voltage to the electrode(s) 107. In some embodiments, the power supply 701 is configured to supply direct current power to the electrode(s) 107. And, in some embodiments, the power supply 701 is configured to supply radiofrequency power to the electrode(s) 107 by way of an appropriately configured impedance matching circuit.

The system of FIG. 7 also includes a control system 703 configured to direct the power supply 701 to supply the clamping voltage to the electrode(s) 107 in either a step-wise manner (such as described with regard to the method of FIG. 3) or a pulsed manner (such as described with regard to the method of FIG. 5) to accumulate and maintain just enough electrical charge on the top support surface 203 of the substrate support structure 103 to securely hold the insulator-type substrate 105 in exposure to the plasma 123. In some embodiments, the control system 703 is configured and connected to receive input regarding the monitored leak rate of the backside cooling gas applied between the insulator-type substrate 105 and the top support surface 203. In these embodiments, the control system 703 is configured to direct the power supply 701 to adjust the clamping voltage supplied to the electrode(s) 107 so as to maintain the monitored leak rate of the backside cooling gas at a level just below a maximum allowable leak rate of the backside cooling gas.

There is a high demand for solid state devices such as LED chips and plasma process technology requiring clamping and de-clamping of insulator-type substrates, such as sapphire and glass, or the like. The methods disclosed herein for controlling the clamping voltage and hence for controlling the time required for release of the substrate 105 from the substrate support structure 103 allow for electrical device manufacturing on insulator-type substrates 105 without the extra cost of conductive material deposition on the backside of the substrate 105, and without the loss of device yield efficiency from the substrate 105 caused by exposure to excessively high temperatures, and without the device yield loss at the substrate 105 edge caused by use of mechanical clamping devices. Therefore, the methods disclosed herein for controlling the clamping voltage applied to the electrostatic-type substrate support structure 103 for holding the insulator-type substrate 105 during plasma processing serve to lower electronic device manufacturing cost and increase electronic device yield per substrate.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for holding an insulator-type substrate during plasma processing of the insulator-type substrate, comprising:
having a substrate support structure formed of a ceramic material, the substrate support structure including an upper conductive region formed within the ceramic material between an electrode within the substrate support structure and a top support surface of the substrate support structure, the upper conductive region doped with a conductive material;
positioning the insulator-type substrate on the top support surface of the substrate support structure;
applying an initial clamping voltage to the electrode within the substrate support structure to rapidly accumulate enough electrical charge on the top support surface to hold the insulator-type substrate on the top support surface;
generating a plasma in exposure to the insulator-type substrate;
flowing a backside cooling gas to a region between the insulator-type substrate and the substrate support structure;
applying a constant voltage to the electrode within the substrate support structure for a non-zero period of time right after applying the initial clamping voltage, wherein the constant voltage has a same polarity as the initial clamping voltage and a lower absolute value than the initial clamping voltage;
applying a pulsed clamping voltage to the electrode within the substrate support structure right after applying the constant voltage, the pulsed clamping voltage transitioning between a set pulse voltage and an off-state voltage; and
controlling the pulsed clamping voltage to control an electrical charge buildup on the top support surface of the substrate support structure to not exceed an electrical charge limit that minimizes an amount of charge dissipation and/or recombination through the upper conductive region of the substrate support structure required to obtain release of the insulator-type substrate from the top support surface upon stopping generation of the plasma, while ensuring that the leak rate of the backside cooling gas does not exceed a maximum allowable leak rate during generation of the plasma.

2. The method as recited in claim 1, wherein a duration of a given pulse of the clamping voltage at the set pulse voltage is within a range extending from about 1 second to about 60 seconds.

3. The method as recited in claim 1, wherein a duration of the off-state voltage between successive pulses of the clamping voltage is within a range extending from about 3 seconds to about 20 seconds.

4. The method as recited in claim 1, wherein the non-zero period of time at which the constant voltage is applied extends up to about 300 seconds.

5. The method as recited in claim 4, wherein the constant voltage is equal to the set pulse voltage.

6. The method as recited in claim 1, further comprising:
monitoring a leak rate of the backside cooling gas from the region between the insulator-type substrate and the substrate support structure; and
upon determining that the leak rate of the backside cooling gas is less than a maximum allowable leak rate, adjusting the pulsed clamping voltage applied to the electrode within the substrate support structure to reduce accumulation of electrical charge on the top support surface of the substrate support structure.

7. The method as recited in claim 6, wherein adjusting the pulsed clamping voltage to reduce accumulation of electrical charge on the top support surface includes one or more of shortening a duration of a given pulse of the clamping voltage at the set pulse voltage, lengthening a duration of the off-state voltage between successive pulses of the clamping voltage, and reducing the set pulse voltage.

8. The method as recited in claim 7, wherein reducing the set pulse voltage corresponds to lowering an absolute value of an existing set pulse voltage by about 1% to about 50%.

9. The method as recited in claim 7, wherein lengthening the duration of the off-state voltage between successive pulses of the clamping voltage corresponds to increasing an existing duration of the off-state voltage by about 1% to about 50%.

10. The method as recited in claim 7, wherein shortening the duration of the given pulse of the clamping voltage at the set pulse voltage corresponds to decreasing an existing duration of the given pulse of the clamping voltage at the set pulse voltage by about 1% to about 50%.

11. The method as recited in claim 6, further comprising:
upon determining that the leak rate of the backside cooling gas is greater than the maximum allowable leak rate, adjusting the pulsed clamping voltage applied to the electrode within the substrate support structure to increase accumulation of electrical charge on the top support surface of the substrate support structure.

12. The method as recited in claim 11, wherein adjusting the pulsed clamping voltage to increase accumulation of electrical charge on the top support surface includes one or more of lengthening the duration of the given pulse of the clamping voltage at the set pulse voltage, shortening the duration of the off-state voltage between successive pulses of the clamping voltage, and increasing the set pulse voltage.

13. The method as recited in claim 1, further comprising:
controlling the pulsed clamping voltage to allow a time required for release of the insulator-type substrate from the top support surface to substantially align with the RC time constant of the upper conductive region.

14. The method as recited in claim 1, further comprising:
controlling the pulsed clamping voltage to reduce electrical charge buildup on the top support surface of the substrate support structure as the plasma processing of the insulator-type substrate approaches completion.

15. The method as recited in claim 1, wherein the non-zero period of time at which the constant voltage is applied is greater than a duration of a given pulse of the clamping voltage at the set pulse voltage.

* * * * *